(12) United States Patent
Wu et al.

(10) Patent No.: US 8,069,398 B2
(45) Date of Patent: *Nov. 29, 2011

(54) METHOD FOR DECODING MULTIWORD INFORMATION

(75) Inventors: Wen-Yi Wu, Jhubei (TW); Li-Lien Lin, Hsinchu (TW); Jia-Horng Shieh, Jhonghe (TW)

(73) Assignee: Mediatek Inc., Hsinchu (TW)

( * ) Notice: Subject to any disclaimer, the term of this patent is extended or adjusted under 35 U.S.C. 154(b) by 1139 days.

This patent is subject to a terminal disclaimer.

(21) Appl. No.: 11/837,351

(22) Filed: Aug. 10, 2007

(65) Prior Publication Data

US 2007/0277080 A1 Nov. 29, 2007

Related U.S. Application Data

(63) Continuation-in-part of application No. 10/711,586, filed on Sep. 27, 2004, now Pat. No. 7,281,193.

(51) Int. Cl.
*H03M 13/00* (2006.01)
(52) U.S. Cl. ........................ 714/776; 714/758
(58) Field of Classification Search .............. 714/776, 714/758
See application file for complete search history.

(56) References Cited

U.S. PATENT DOCUMENTS

| | | | | |
|---|---|---|---|---|
| 4,897,787 | A * | 1/1990 | Kawasaki et al. | 712/208 |
| 5,740,186 | A * | 4/1998 | Widmer | 714/753 |
| 6,367,049 | B1 * | 4/2002 | Van Dijk et al. | 714/761 |
| 6,378,100 | B1 | 4/2002 | Van Dijk | |
| 6,604,217 | B1 * | 8/2003 | Kahlman | 714/752 |
| 6,621,982 | B1 * | 9/2003 | Kimura et al. | 386/268 |
| 6,678,859 | B1 | 1/2004 | Senshu | |
| 7,055,082 | B2 | 5/2006 | Mori et al. | |
| 7,058,875 | B2 | 6/2006 | Jeon et al. | |
| 7,111,222 | B2 | 9/2006 | Takagi et al. | |
| 7,188,295 | B2 | 3/2007 | Van Dijk et al. | |

(Continued)

FOREIGN PATENT DOCUMENTS

CN 1253674 A 5/2000

(Continued)

OTHER PUBLICATIONS

IEEE Transactions on Magnetics, vol. 37, No. 2, Mar. 2001; Channel Coding and Signal Processing for Optical Recording Systems Beyond DVD p. 682-p. 688.

(Continued)

*Primary Examiner* — M. Mujtaba Chaudry
(74) *Attorney, Agent, or Firm* — Connolly Bove Lodge & Hutz LLP

(57) ABSTRACT

A method for decoding multiword information comprises steps (a) to (e). In step (a), a multiword information cluster, e.g., ECC, including high protective codewords, e.g., BIS, and low protective codewords, e.g., LDC, is provided. In step (b), the high and low protective codewords are stored into a first memory, e.g., DRAM. In step (c), the high protective codewords are decoded to generate high protective word erasure indicators showing whether decoding errors occur. In step (d), the high protective word erasure indicators are stored into a second memory, e.g., SRAM. In step (e), the low protective codewords are decoded. In the meanwhile, an erasure bit for a low protective codeword is marked by finding high protective codewords close to the low protective codeword in the multiword information cluster and looking up the high protective word erasure indicators of the high protective codewords close to the low protective codeword.

26 Claims, 16 Drawing Sheets

U.S. PATENT DOCUMENTS

| | | |
|---|---|---|
| 7,272,772 B2 | 9/2007 | Takagi et al. |
| 2002/0157055 A1 | 10/2002 | Coene et al. |
| 2003/0103429 A1 | 6/2003 | Senshu |
| 2003/0208714 A1* | 11/2003 | Kahlman ............ 714/758 |
| 2004/0103360 A1 | 5/2004 | Mori et al. |
| 2004/0187065 A1 | 9/2004 | Hwang et al. |
| 2005/0015698 A1 | 1/2005 | Kim et al. |
| 2005/0022096 A1 | 1/2005 | Kim et al. |
| 2005/0154959 A1 | 7/2005 | Van Dijk et al. |
| 2005/0229085 A1 | 10/2005 | Van Dijk et al. |
| 2005/0265387 A1* | 12/2005 | Khojastepour et al. ....... 370/467 |

FOREIGN PATENT DOCUMENTS

| | | |
|---|---|---|
| EP | 1 453 209 A2 | 9/2004 |
| JP | 2001-048171 | 2/2001 |
| JP | 2002152055 A | 5/2002 |
| JP | 2002-521789 | 7/2002 |
| JP | 2003-036608 | 2/2003 |
| JP | 2003123394 A | 4/2003 |
| JP | 2004-146014 | 5/2004 |
| JP | 2004-152409 | 5/2004 |
| JP | 2004-259426 | 9/2004 |
| JP | 2004295958 A | 10/2004 |
| WO | WO 9934271 | 8/1999 |
| WO | WO 03/085839 A1 | 10/2003 |
| WO | WO 2004/021619 A2 | 3/2004 |

OTHER PUBLICATIONS

Blu-ray Disc Founders, Aug. 2004; White Blu-ray Disc Format 1.B Physical Format Specifications for BD-R.

"Decoding organisation for product codes", XP000326654, 1992.

Japan J. Appl. Phys. vol. 39, (2000), pp. 912-919.

Narahara, Tatsuya, et al., *Optical Disc System for Digital Video Recording* (2000), vol. 39, pp. 912-919, Japan J. Appl. Phys.

\* cited by examiner

| Byte k | | Row n | Row n+1 | Row n+2 | Row n+3 | Row n+4 | Row n+5 | Row n+6 | Row n+7 |
|---|---|---|---|---|---|---|---|---|---|
| | | SYNC | SYNC | SYNC | SYNC | SYNC | SYNC | SYNC | SYNC |
| | Bit | 0 | 1 | 2 | 3 | 4 | 5 | 6 | 7 |
| | Data | | | | | | | | |

| Byte k+1 | | Row n | Row n+1 | Row n+2 | Row n+3 | Row n+4 | Row n+5 | Row n+6 | Row n+7 |
|---|---|---|---|---|---|---|---|---|---|
| | | BIS1 | BIS1 | BIS1 | BIS1 | BIS1 | BIS1 | BIS1 | BIS1 |
| | Bit | 0 | 1 | 2 | 3 | 4 | 5 | 6 | 7 |
| | Data | | | | | | | | |

| Byte k+2 | | Row n | Row n+1 | Row n+2 | Row n+3 | Row n+4 | Row n+5 | Row n+6 | Row n+7 |
|---|---|---|---|---|---|---|---|---|---|
| | | BIS2 | BIS2 | BIS2 | BIS2 | BIS2 | BIS2 | BIS2 | BIS2 |
| | Bit | 0 | 1 | 2 | 3 | 4 | 5 | 6 | 7 |
| | Data | | | | | | | | |

| Byte k+3 | | Row n | Row n+1 | Row n+2 | Row n+3 | Row n+4 | Row n+5 | Row n+6 | Row n+7 |
|---|---|---|---|---|---|---|---|---|---|
| | | BIS3 | BIS3 | BIS3 | BIS3 | BIS3 | BIS3 | BIS3 | BIS3 |
| | Bit | 0 | 1 | 2 | 3 | 4 | 5 | 6 | 7 |
| | Data | | | | | | | | |

FIG. 5(b)

|  | 19 codewords | | | | | | |
|---|---|---|---|---|---|---|---|
| $d_{0,A}$ | $d_{216,A}$ | : | $d_{1944,A}$ | $d_{108,B}$ | : | $d_{1836,B}$ |
| $d_{1,A}$ | $d_{217,A}$ | : | $d_{1945,A}$ | $d_{109,B}$ | : | $d_{1837,B}$ |
| $d_{2,A}$ | : | : | : | : | : | : |
| $d_{3,A}$ | : | : | : | : | : | : |
| ↓ | ↓ | : | ↓ | ↓ | : | ↓ |
| : | : | : | $d_{2047,A}$ | : | : | : |
| : | : | : | $e_{2048,A}$ | : | : | : |
| : | : | : | : | : | : | : |
| : | : | : | $e_{2051,A}$ | : | : | : |
| : | : | : | $d_{0,B}$ | : | : | : |
| : | : | : | $d_{1,B}$ | : | : | : |
| ↓ | ↓ | : | ↓ | ↓ | : | ↓ |
| : | : | : | : | : | : | $d_{2047,B}$ |
| : | : | : | : | : | : | $e_{2048,B}$ |
| : | : | : | $d_{106,B}$ | : | : | : |
| $d_{215,A}$ | $d_{431,A}$ | : | $d_{107,B}$ | $d_{323,B}$ | : | $e_{2051,B}$ |

216 rows with data

FIG. 5(d)

| | codeword 0 | codeword 1 | ... | codeword C | ... | codeword 22 | codeword 23 |
|---|---|---|---|---|---|---|---|
| | $b_{0,0}$ $b_{1,0}$ ... $b_{29,0}$ | $b_{0,1}$ $b_{1,1}$ ... $b_{29,1}$ | ... | $b_{0,C}$ $b_{1,C}$ $b_{N,C}$ ... $b_{29,C}$ | ... | ... | $b_{0,23}$ $b_{1,23}$ ... $b_{29,23}$ |
| | $Pb_{30,0}$ ... $Pb_{61,0}$ | $Pb_{30,1}$ ... $Pb_{61,1}$ | ... | $Pb_{30,C}$ ... $Pb_{61,C}$ | ... | ... | $Pb_{30,23}$ ... $Pb_{61,23}$ |

24 columns

← 30 information → ← 32 parity →

← 1 BIS codeword = 62 bytes →

| | | | | | | | | | | | | | | | |
|---|---|---|---|---|---|---|---|---|---|---|---|---|---|---|---|
| | | | | | | 24 columns | | | | | | | | | |
| ↑ 6 rows with Physical Addresses ↓ | AF$_{0,0}$ | AF$_{1,0}$ | AF$_{2,0}$ | AF$_{0,7}$ | AF$_{1,7}$ | AF$_{2,7}$ | AF$_{0,6}$ | AF$_{1,6}$ | AF$_{2,6}$ | AF$_{0,5}$ | ... | AF$_{0,1}$ | AF$_{1,1}$ | AF$_{2,1}$ | ↑ 30 rows ↓ |
| | AF$_{0,8}$ | AF$_{1,8}$ | AF$_{2,8}$ | AF$_{0,15}$ | ... | ... | AF$_{0,14}$ | ... | ... | AF$_{0,13}$ | ... | AF$_{0,9}$ | AF$_{1,9}$ | AF$_{2,9}$ | |
| | AF$_{4,1}$ | AF$_{5,1}$ | AF$_{3,1}$ | AF$_{4,0}$ | AF$_{5,0}$ | AF$_{3,0}$ | AF$_{4,7}$ | AF$_{5,7}$ | AF$_{3,7}$ | AF$_{4,0}$ | ... | AF$_{4,2}$ | AF$_{5,2}$ | AF$_{3,2}$ | |
| | AF$_{4,9}$ | ... | ... | AF$_{4,8}$ | AF$_{5,8}$ | AF$_{3,8}$ | AF$_{1,15}$ | ... | ... | AF$_{4,14}$ | ... | AF$_{4,10}$ | AF$_{5,10}$ | AF$_{3,10}$ | |
| | AF$_{8,2}$ | AF$_{6,2}$ | AF$_{7,2}$ | AF$_{8,1}$ | AF$_{5,1}$ | AF$_{7,1}$ | AF$_{8,0}$ | AF$_{6,0}$ | AF$_{7,0}$ | AF$_{8,7}$ | ... | AF$_{8,3}$ | AF$_{6,3}$ | AF$_{7,3}$ | |
| | AF$_{8,10}$ | ... | ... | AF$_{8,9}$ | ... | ... | AF$_{8,8}$ | ... | ... | AF$_{8,15}$ | ... | AF$_{8,11}$ | AF$_{6,11}$ | AF$_{7,11}$ | |
| ↑ 24 rows with User Control Data ↓ | UC$_{0,0}$ | UC$_{6,1}$ | UC$_{12,2}$ | UC$_{0,4}$ | ... | ... | ... | ... | ... | ... | ... | ... | ... | UC$_{12,30}$ | |
| | ... | ... | UC$_{17,2}$ | ... | ... | ... | ... | ... | ... | ... | ... | ... | ... | ... | |
| | ... | UC$_{17,1}$ | UC$_{0,3}$ | UC$_{17,4}$ | ... | ... | ... | ... | ... | ... | ... | ... | ... | UC$_{17,30}$ | |
| | ... | UC$_{0,2}$ | ... | UC$_{0,5}$ | ... | ... | ... | ... | ... | ... | ... | ... | UC$_{0,30}$ | UC$_{0,31}$ | |
| | UC$_{17,0}$ | ... | ... | ... | ... | ... | ... | ... | ... | ... | ... | ... | ... | ... | |
| | UC$_{0,1}$ | ... | ... | ... | ... | ... | ... | ... | ... | ... | ... | ... | ... | ... | |
| | UC$_{6,1}$ | UC$_{8,1}$ | UC$_{17,3}$ | ... | ... | ... | ... | ... | ... | ... | ... | ... | UC$_{11,30}$ | UC$_{17,31}$ | |

METHOD FOR DECODING MULTIWORD INFORMATION

CROSS-REFERENCE TO A RELATED APPLICATION

This application is a Continuation Application (CA) of U.S. patent application Ser. No. 10/711,586 filed on Sep. 27, 2004.

BACKGROUND OF THE INVENTION (A) Field of the Invention

The present invention is related to a method for decoding multiword information, which are applied to an optical disk device.

(B) Description of the Related Art

As shown in FIG. 1, an Error Correction Code (ECC) cluster 10 includes 152 long-distance code (LDC) data columns, one SYNC data column 11 and three burst indicator subcode (BIS) data columns 12, wherein the LDC data columns are separated into four LDC blocks 13 by the SYNC data column 11 and three BIS data columns 12. The original LDC data are discontinuous and interleaved into different LDC blocks 13. Some ECC encoding or decoding techniques were described in U.S. Pat. No. 6,378,100, U.S. Pat. No. 6,367,049, U.S. Pat. No. 6,604,217 and US 2003/0208714, wherein U.S. Pat. No. 6,378,100 disclosed a method for encoding multiword information, U.S. Pat. No. 6,367,049 disclosed an encoding method by interleaving, U.S. Pat. No. 6,604,217 disclosed a decoding method using synchronization (SYNC) codes, BIS codes or their dynamic or static combination as an erasure, and US 2003/0208714, a continuation application of U.S. Pat. No. 6,604,217, further disclosed a method using SYNC code as an erasure indicator. Further, Narahara et al. disclosed an error correction method using LDC and BIS codes that was published in Jpn. J. Appl. Phys. Vol. 39 (2000) pp. 912-919.

However, the patents and article mentioned above only raised a concept of methods for decoding ECC data, i.e., they do not explicitly disclose practical implementation methods. Under such circumstances, it is necessary to develop a useful implementation method and apparatus for decoding ECC data.

SUMMARY OF THE INVENTION

The objective of the present invention is to provide a method for effectively decoding multiword information, e.g., ECC data. Currently, the method and apparatus of the present invention can be applied to a so-called Blu-ray disk decoding.

BIS codes are relatively high protective in comparison with LDC codes so that errors are more easily detected in BIS codes. If an error is detected in two close BIS codes in a row of an ECC cluster, it indicates errors may occur in the LDC data in the row and between these two BIS codes. Therefore, an erasure bit of the LDC date can be marked as an erasure indicator, thereby LDC decoding or correction efficiency is increased. Furthermore, SYNC codes included in the ECC cluster can also be employed and combined with BIS codes to generate the LDC erasure bits. If a sync erasure indicator and its close BIS erasure indicators are detected, the LDC data disposed therebetween may have (an) error(s).

The BIS erasure indicators or the LDC erasure bit can be stored in a memory, e.g., a dynamic random access memory (DRAM). However, the LDC data are interleaved in the ECC cluster, i.e., the original LDC data are discontinuous and disposed in multiple LDC blocks, so the location of each LDC data has to be retrieved from the DRAM individually. Thus, the DRAM bandwidth will be increased if all the erasure indicators are stored in the DRAM, and therefore the decoding efficiency will be decreased.

To increase the ECC decoding efficiency, a method for decoding multiword information is disclosed. The method comprises steps (a) to (e). In step (a), a multiword information cluster (ECC) including high protective codewords (BIS) and low protective codewords (LDC) is provided. In step (b), the high and low protective codewords are stored into a first memory, e.g., DRAM. In step (c), the high protective codewords are decoded to generate high protective word erasure indicators showing whether decoding errors occur. In step (d), the high protective word erasure indicators are stored into a second memory, e.g., SRAM. In step (e), the low protective codewords are decoded. Meanwhile, an erasure bit of a low protective word is marked by finding high protective codewords close to the low protective codeword in a row of the multiword information cluster, looking up the high protective word erasure indicators of the high protective codewords close to the low protective codeword.

The method mentioned above can be implemented by an apparatus comprising a first memory, a decoder, a mapping circuit, a second memory and an erasure generator. The first memory is intended to store high protective codewords and low protective codewords of a multiword information cluster. The decoder is coupled to the first memory for decoding the high protective codewords so as to generate high protective word erasure indicators. The mapping circuit is coupled to the decoder and is intended to point out the locations of the high protective codewords corresponding to the high protective word erasure indicators in a row of the multiword information cluster, so as to provide localities for high protective word erasure indicators. The second memory is coupled to the mapping circuit for storing the high protective word erasure indicators with localities. The erasure generator is coupled to the second memory for generating an erasure bit of a low protective codeword by looking up the high protective word erasure indicators in the second memory, wherein the high protective codewords corresponding to the high protective word erasure indicators are close to the low protective codeword in a row of the multiword information cluster.

BRIEF DESCRIPTION OF THE DRAWINGS

FIGS. 5(a) and 5(b) illustrate SYNC erasure indicators and BIS erasure indicators stored in an SRAM in accordance with another embodiment of the present invention;

FIG. 5(d) illustrates the LDC data of the first and second sectors after de-interleaving;

FIGS. 6(b) through 6(d) illustrate BIS data composed of address field information and user control data.

DETAILED DESCRIPTION OF THE INVENTION

Figure 1:
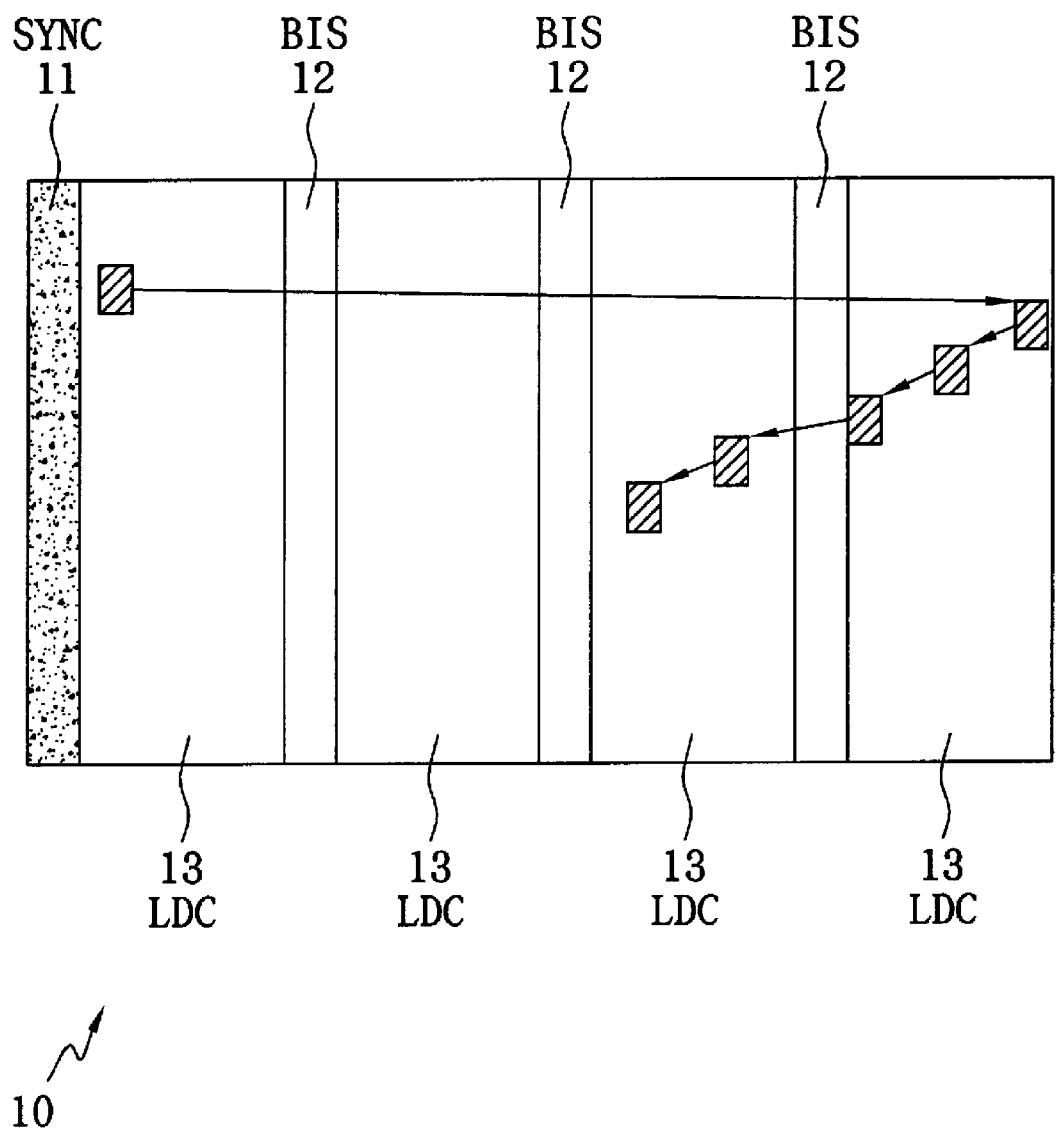
FIG. 1 illustrates a known ECC cluster.
Figure 2A:
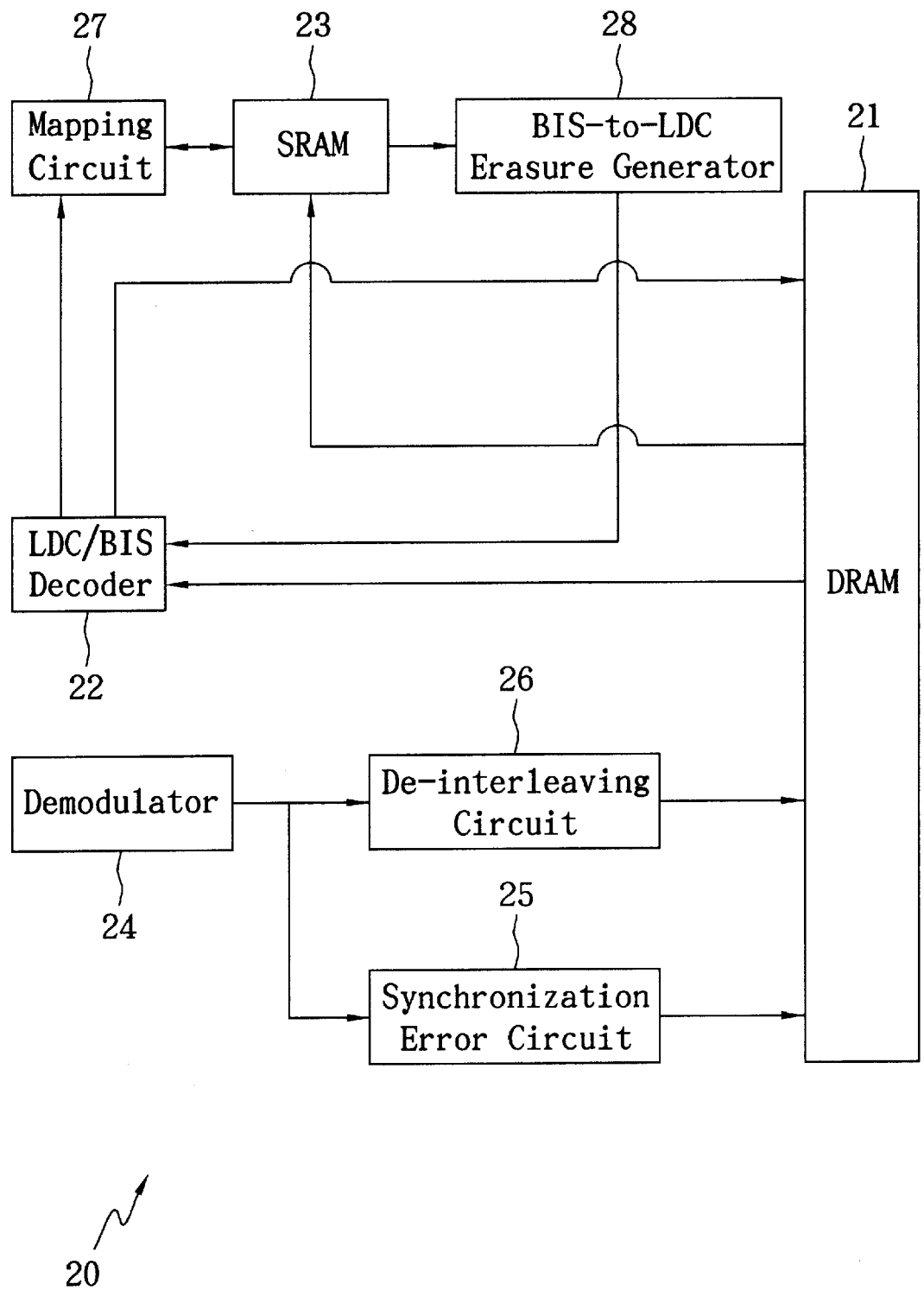
FIGS. 2(a) through 2(c) illustrate apparatuses for decoding ECC clusters in accordance with the present invention.

FIG. 2(a) is a schematic view of an apparatus 20 for decoding multiword information in accordance with the present invention. The apparatus 20 includes a first memory, e.g., DRAM 21, an LDC/BIS decoder 22, a second memory, e.g., SRAM 23, a demodulator 24, a synchronization error circuit 25, a de-interleaving circuit 26, a mapping circuit 27, a BIS-to-LDC erasure generator 28.

Figure 3:
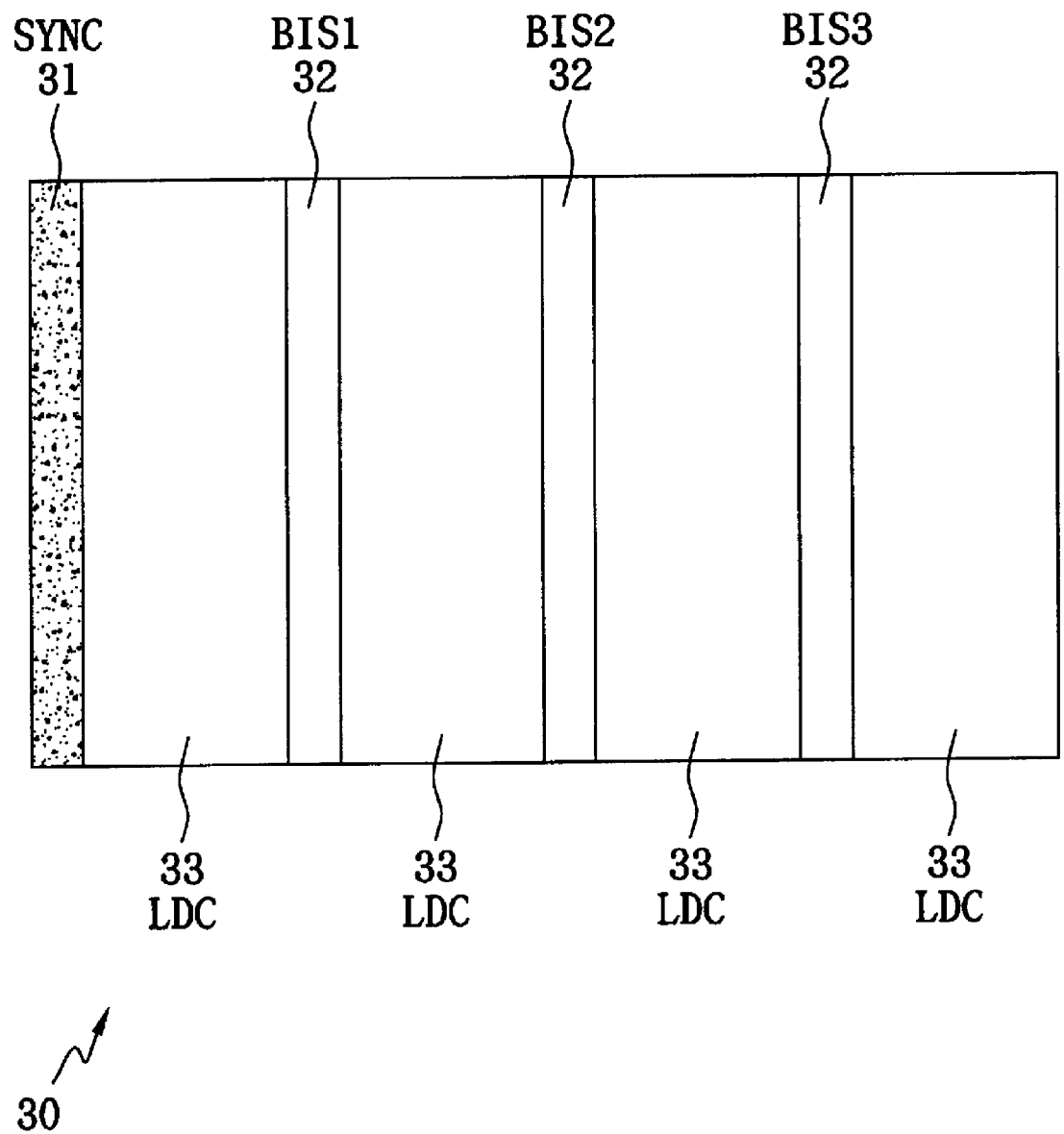
FIG. 3 illustrates an ECC cluster for explaining the method in accordance with the present invention.

As shown in FIG. 3, an ECC cluster 30 includes a SYNC code column 31, three BIS data columns 32 and four LDC blocks 33 in which each of the blocks 33 has 38 LDC data columns. Besides, the ECC cluster 30 includes 496 rows. The BIS data columns 32, from left to right, are denoted by BIS 1, BIS2 and BIS3, respectively.

Referring back to FIG. 2(a), the LDC and BIS data in the ECC cluster 30 are demodulated to be 8-bit through the demodulator 24, and then the LDC and BIS data are stored in an internal memory, e.g., SRAM, built in the de-interleaving circuit 26 for being de-interleaved. The LDC and BIS data are de-interleaved into 304 LDC codes with length of 248 bytes and 24 BIS codes with length of 62 bytes, respectively, and SYNC codes of the ECC cluster 30 are transmitted into the synchronization error circuit 25 for SYNC error detection so as to generate SYNC erasure indicators. Errors of synchronization codes can also be utilized in the present invention. When errors of synchronization codes included in the multiword information cluster are detected, synchronization erasure indicators are next generated and stored in the first memory. Like the BIS erasure indicators, the synchronization erasure indicators function as the high protective word erasure indicators for generating the erasure bit while the low protective codewords are being decoded.

Figure 2B:
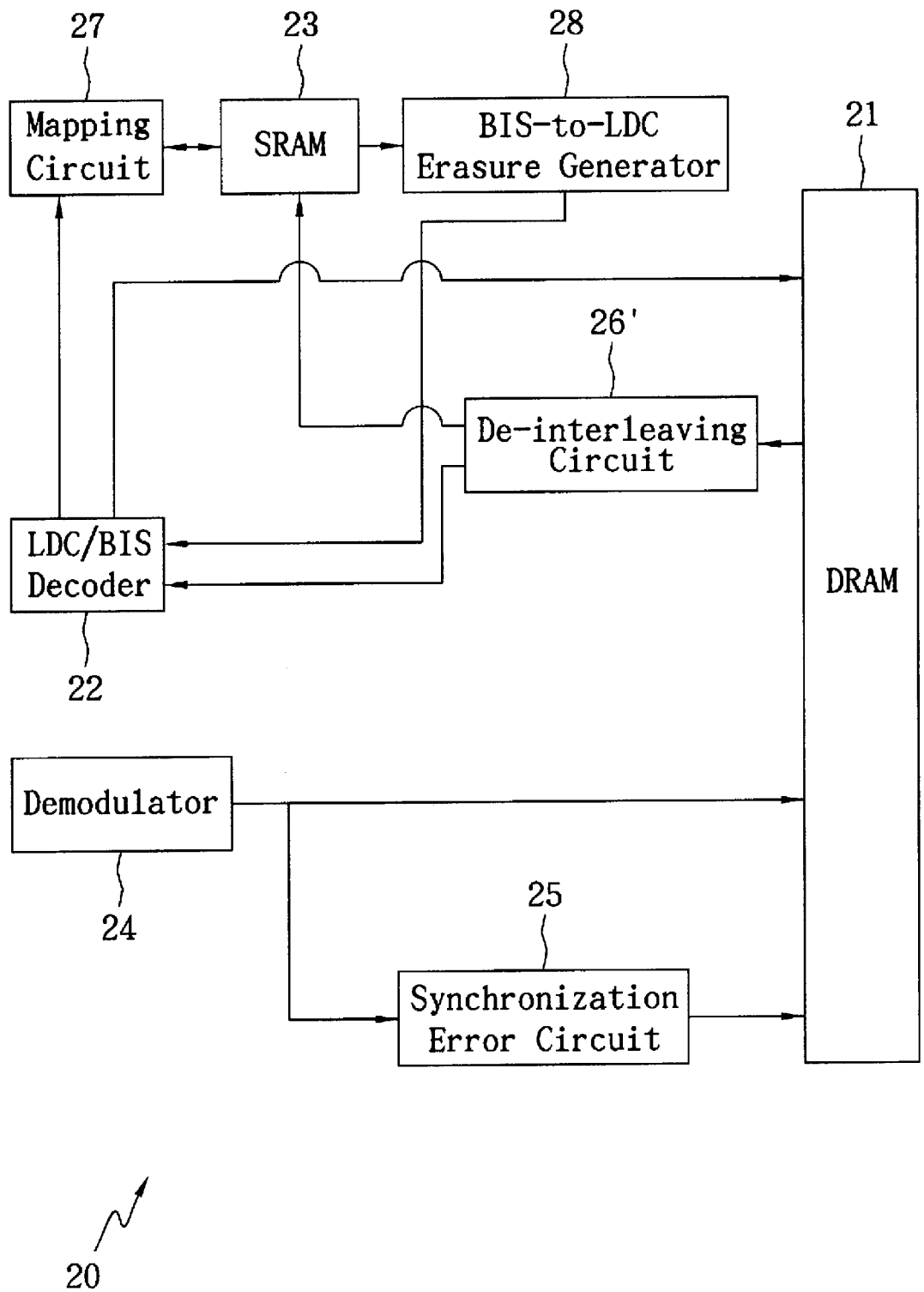
Figure 2C:
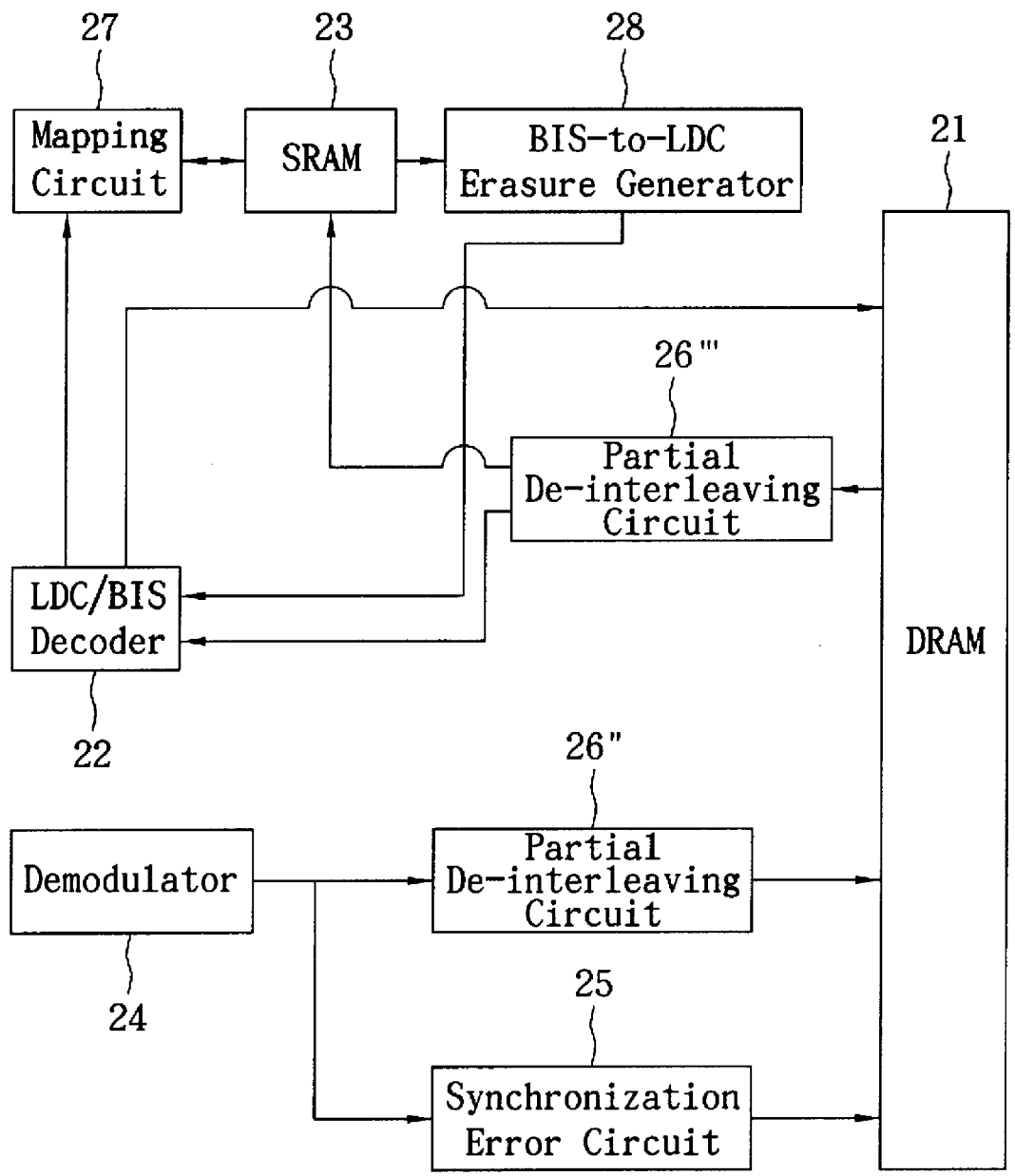

If the SYNC errors are detected, SYNC erasure indicator will be assigned by "1," otherwise by "0." As to the determination of the SYNC error, if the data received at the SYNC position is different from SYNC pattern before demodulation, e.g., SYNC0 pattern in Blu-Ray=01 010 000 000 010 000 000 010 or the number of data between two close SYNC columns 31 is incorrect, any discontinuous SYNC code is found, or the read channel shows that the data close to SYNC code is not reliable, they can be deemed to be a SYNC error. Sequentially, the SYNC erasure indicators and the de-interleaved LDC and BIS data are stored in the DRAM 21. Alternatively, a de-interleaving circuit 26' can also be disposed between the DRAM 21 and SRAM 23/decoder 22, and thus the LDC and BIS data are stored in the DRAM 21 before de-interleaving as shown in FIG. 2(b). Another alternative method is that the DRAM 21 stores a partial de-interleaving LDC and BIS data, and the rest of LDC and BIS data are de-interleaved while being read from DRAM as shown in FIG. 2(c), wherein a partial de-interleaving circuit 26" and another partial de-interleaving circuit 26''' are employed.

The BIS data stored in the DRAM 21 are transmitted into the LDC/BIS decoder 22 for decoding, thereby BIS erasure indicators are generated. For instance, if errors are detected during decoding, the BIS erasure indicators are assigned by "1," otherwise by "0." Then, the BIS erasure indicators go through the mapping circuit 27 to relocate themselves, the corresponding BIS data of which in the ECC cluster 30 are pointed out so as to establish the location relation between the BIS erasure indicators and the LDC data in the ECC cluster 30.

A possible mapping function of the mapping circuit 27 is shown as follows:

$$(N,C) \rightarrow (u \times 31 + r, e)$$

where (N,C) is the location in BIS block; N indicates the location in one BIS code (0~61); C indicates the BIS code number (0~23);

and where (u,r,e) is the location in BIS cluster; U indicates the unit number $u = \mod(\{\text{div}(N,2)+8-\text{div}(C,3)\},8)+8 \times \mod(N,2)$; R indicates the row number; $r = \text{div}(N,2)$; E indicates the column number $e = \mod(\{C+\text{div}(N,2)\},3)$.

Afterwards, the BIS erasure indicators with localities are stored in the SRAM 23. In addition, the SYNC erasure indicators can be transmitted and stored in the SRAM 23. Consequently, there are four possible erasure indicators generated in each row of the ECC cluster 30, so four bits are employed to store the possible SYNC erasure indicator and three BIS erasure indicators. Accordingly, one byte can store erasure indicators of two rows in an ECC cluster, and 248 bytes ($496 \times 4/8 = 248$) are needed for each ECC cluster.

Figure 4:
FIG. 4 illustrates SYNC erasure indicators and BIS erasure indicators stored in an initialized SRAM in accordance with one embodiment of the present invention.

In the beginning of decoding an ECC cluster, the SRAM 23 has to be initialized to overwrite previous data therein, i.e., the fields of SYNC erasure indicators in the SRAM 23 are overwritten by the SYNC erasure indicators stored in the DRAM 21, and BIS erasure indicators are all reset to be zero. FIG. 4 illustrates a byte in the SRAM 23 that is initialized, where the SYNC erasure indicators of address 0 and address 4 are assigned by the SYNC erasure indicators S0 and S1 in the DRAM 21. S0 is the sync. erasure indicator of the first row, whereas S1 is the sync. erasure indicator of the second row, and the BIS erasure indicators are reset to "0."

Figure 5A:

FIG. 5(a) illustrates an example of erasure indicators stored in the SRAM 23, wherein the SYNC as well as BIS2 fields of the second row and BIS 1 as well as BIS 3 fields of the first row exhibit errors. The situations mean that errors may occur in the LDC data close to or between the error-exhibiting SYNC or BIS data in the same row of the ECC cluster.

As shown in FIG. 4, 1 byte of the SRAM 23 in FIG. 2(a) comprises SYNCs of the first and second rows and BIS erasure indicator. Alternatively, 1 byte of the SRAM 23 can also comprises the erasure indicators in the column direction. The erasure indicators can be stored along the columns instead of rows. As shown in FIG. 5(b), the SYNC, BIS1 erasure indicator, BIS2 erasure indicator and BIS3 erasure indicator of row "n" are respectively stored in the bit "0" of Byte k, Byte k+1, Byte k+2 and Byte k+3 of a SRAM, whereas the SYNC, BIS1 erasure indicator, BIS2 erasure indicator and BIS3 erasure indicator of row "n+1" are respectively stored in the bit "1" of Byte k, Byte k+1, Byte k+2 and Byte k+3 of the SRAM. The erasure indicators can also be stored by any other mapping formats which will benefit to the writing and/or reading efficiency of SRAM 23. For example, the erasure indicators can be stored by the sequence for LDC's decoding or by the positions of the BIS or SYNC errors or by the format of $\alpha^{loc_i}$, wherein $\alpha$ is the root of primitive polynomial, and $loc_i$ is the number i, which the erasure bit of the i-th word in an LDC codeword is not zero.

When an LDC datum is being decoded, the BIS-to-LDC erasure generator 28 retrieves the SYNC or BIS erasure indicators of the BIS data or SYNC codes close to the LDC data in the ECC cluster from the SRAM 23. Consequently, an LDC erasure bit may be generated base on the SYNC or BIS erasure indicators, i.e., the LDC erasure bit is generated by mapping the LDC data location back to the ECC cluster, and looking up the SYNC and BIS erasure indicators stored in the SRAM 23.

Figure 5C:
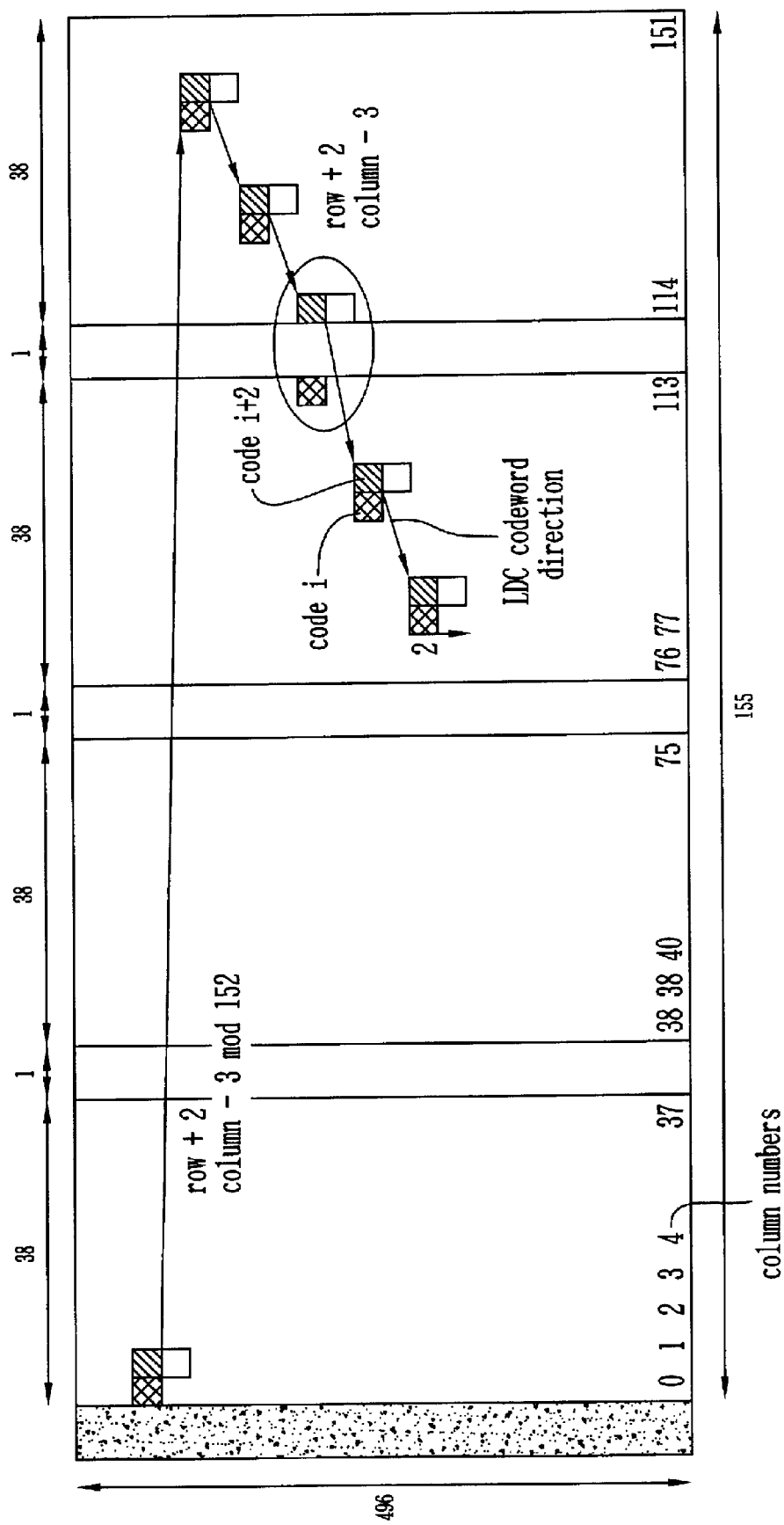
FIG. 5(c) illustrates the correspondence of LDC and SYNC/BIS codes.

An incremental LDC erasure access method may be applied during the LDC decoding. For two close LDC codewords, most erasure bits refer to the same SYNC and BIS erasure indicators due to the property of interleaving. Only part of erasure bits need to look up different SYNC and BIS erasure indicators stored in the SRAM 23. As shown in FIG. 5(c), owing to interleaving sequence, the erasures of most codewords i and i+2 read the same SYNC/BIS, except the two codewords i and i+2 are separated by a SYNC/BIS due to interleaving. Therefore, when the erasure of codeword i+2 is read, the portion of erasures across the SYNC/BIS only need to be updated.

There are four possible strategies as shown in Table 1 to mark an LDC erasure bit. Note that "x" indicates don't care, it may be "1" or "0".

1. Strategy 0: if the BIS erasure indicators of the BIS data at both sides of the LDC data are "1," an LDC erasure bit is generated to indicate that this LDC data area may have (an) error(s).
2. Strategy 1: if the BIS erasure indicators of the second BIS data from left and the right BIS data next to the LDC data are "1," or the BIS erasure indicators of the left BIS data next to the LDC data and the second BIS data from right are "1," an LDC erasure is generated. (Table 1 uses the two BIS/SYNCs before and after LDC data to generate different strategy, and is irrelevant to the leftmost and rightmost BIS data)
3. Strategy 2: if the BIS erasure indicators of the two left BIS data or the two right BIS data next to the LDC data are "1," an LDC erasure is generated.
4. Strategy 3: if the BIS erasure indicator of a BIS code at either side next to the LDC data is "1," an LDC erasure is generated.

In practice, a SYNC erasure indicator can be associated with the BIS erasure indicator and functions the same as the BIS erasure indicator to generate an LDC erasure bit. The LDC erasure bit is generated by looking up the SYNC and BIS erasure indicators stored in the SRAM 23 using aforementioned strategies. Alternatively, after BIS decoding, the erasure indicator can finish the strategy selection and computation, and stored in SRAM 23 afterwards. Then, the LDC erasure bit is generated by looking up the result of strategy selection from SRAM 23.

TABLE 1

|  | BIS | BIS | LDC Data | BIS | BIS |  |
|---|---|---|---|---|---|---|
| Strategy 0 | x | 1 | LDC Data | 1 | x |  |
| Strategy 1 | 1 | x | LDC Data | 1 | x | or |
|  | x | 1 | LDC Data | x | 1 |  |
| Strategy 2 | 1 | 1 | LDC Data | x | x | or |
|  | x | x | LDC Data | 1 | 1 |  |
| Strategy 3 | x | 1 | LDC Data | x | x | or |
|  | x | x | LDC Data | 1 | x |  |

The above strategies can be switched automatically. For instance, the loose strategy 3 is employed first, followed by a strict strategy 2. If the number of the erasure bits generated by strategy 3 exceeds a threshold number, e.g., 32, it indicates that there are so many LDC errors that the following decoding action may not be performed. The setting of the erasure bits will be automatically switched to another strategy until the number of the erasure bits is smaller than a threshold number. If any decoding error occurs in the ECC cluster, re-buffering data may need to be performed. Only if those data that failed to pass error detection code (EDC) check, the demodulated data in DRAM 21 needs to be overwritten. As shown in FIG. 5(d), in which the LDC data of FIG. 5(c) are arranged in order after de-interleaving, and the first and second sectors are exemplified herein. If first sector is passed EDC check, but the second one is not, only the second sector is overwritten when re-buffering into the DRAM. For decoding, LDC codewords 0-8 need not to be decoded due to the pass of EDC check. For decoding codeword 9, because the upper portion belongs to sector "0," and the lower portion belongs to sector "1", the erasure bit of the portion belongs to sector "0" has to be assigned to "0" when the erasure bit is read. The portion for protecting sector "0" is not changed for correction. Accordingly, the re-buffered ECC cluster will be decoded, and the LDC erasure bit uses the previous so-called error detection code (EDC).

Sequentially, the LDC erasure bit is transmitted into the LDC/BIS decoder 22 to correct the relevant LDC data, and the corrected LDC data is sent back to the DRAM 21.

Figure 6A:
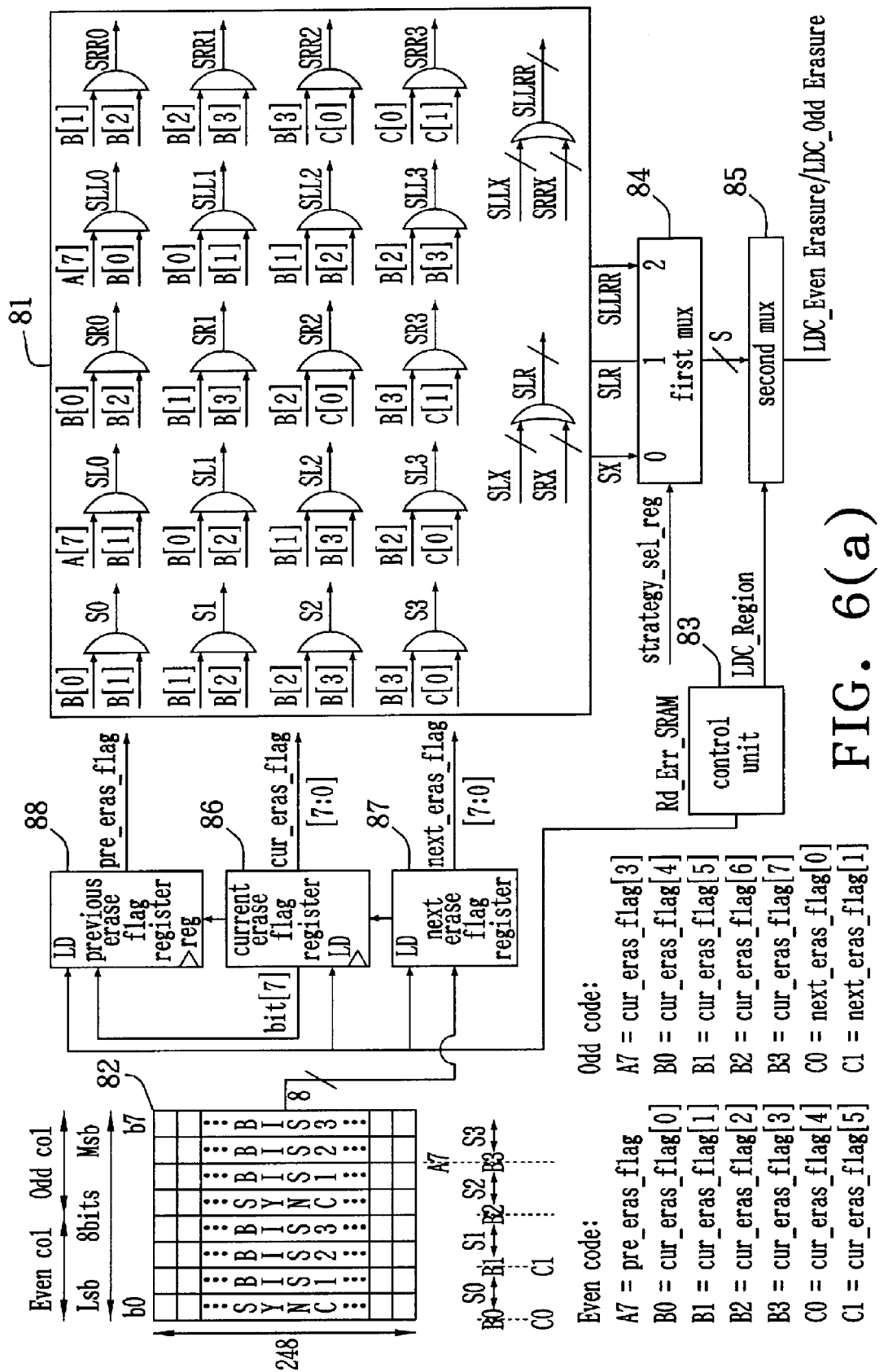
FIG. 6(a) illustrates a detailed structure for creating erasure bits in accordance with one embodiment of the present invention.

FIG. 6(a) illustrates a detailed structure for creating erasure bits in accordance with table 1 of the present invention. A possible format of the content of the SRAM 23 is shown as a table 82, which contains 248 bytes, and each byte stores SYNC and BIS data belonging to two rows of an ECC cluster. The content of the table 82 is forwarded to a next erasure flag register 87, and further forwarded to a current erasure flag register 86 and a previous flag register 88 erasure by erasure. The outputs of the next erasure flag register 87, the current erasure flag register 86 and the previous flag register 88 are transmitted to a combinational logic 81 for setting erasure bits of the above three kinds of strategies. A first multiplexer (mux) 84 is connected to the three outputs SX, SLR and SLLRR of the combinational logic 81 and selects one based on a control signal "strategy_sel_reg" according to the strategy of creating erasure bits. A second multiplexer 85 is connected to the first multiplexer 84 and a control unit 83 for selecting the erasure of that LDC region.

Figure 6D:
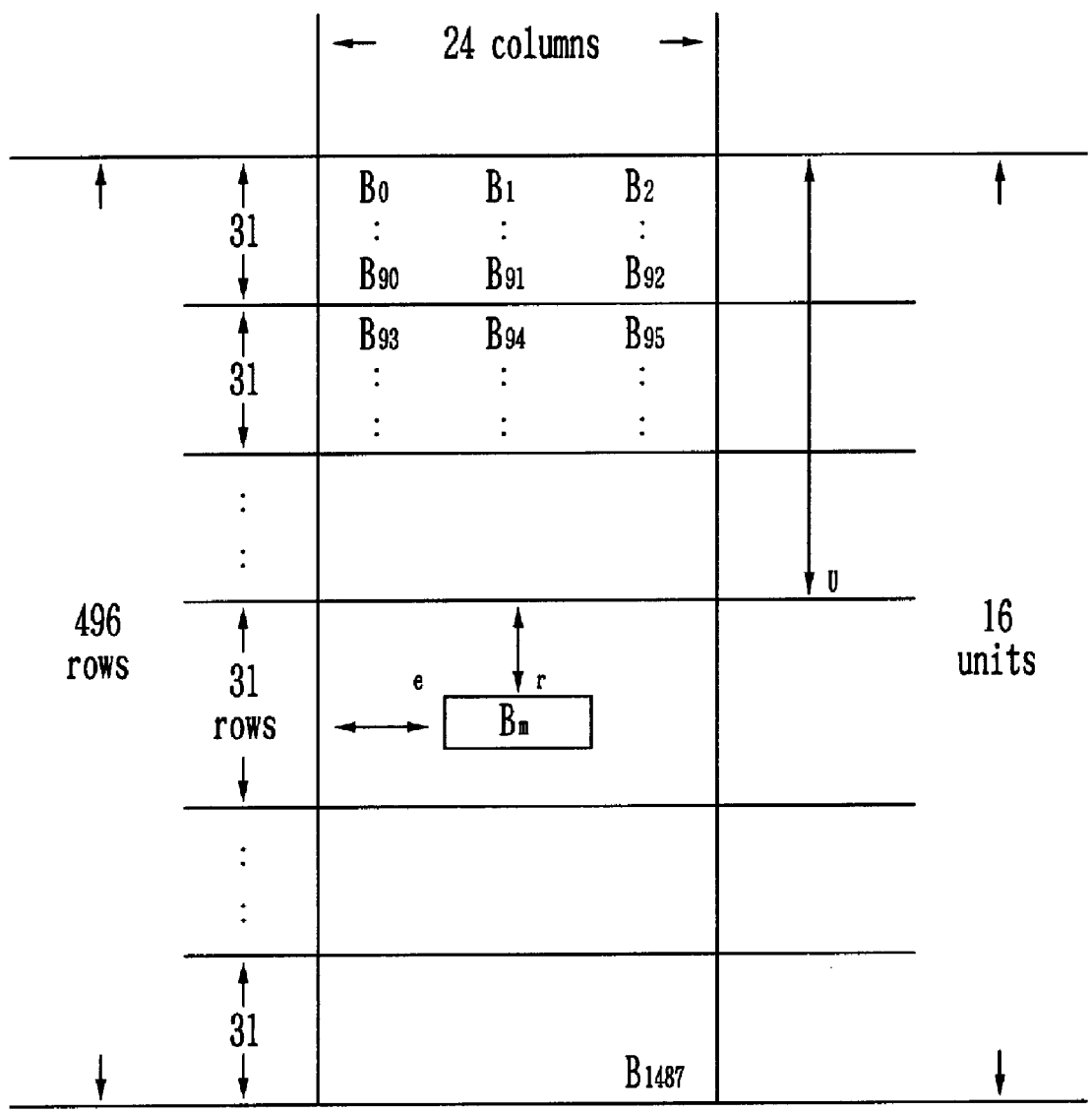

BIS data shown in FIGS. 6(b), 6(c) and 6(d) are composed of address field (AF) information and user control (UC) data, wherein AF comprises addresses and the parities thereof. Because addresses are continuous, all the addresses can be forwardly or backwardly deduced upon a known address. Therefore, the position of AF data of BIS can be compared to that of an expected AF data. If the AF position is different from that of the expected one, which is deemed an erasure indicator. Further, because AF data is protected by coding, the AF decoding results can be erasure indicators. If UC is not specified by the application, the UC data bytes shall be set to 00 0h. To compare the UC data of BIS and 0, if different, the UC data can be deemed erasure indicators. Because AF and UC are known already, the parity of BIS block can be calculated. The calculated parity can be compared to the data of received parity of BIS, so as to generate erasure indicators. BIS data not only can be marked as erasure by comparing AF or UC expected data before BIS ECC decoder, but also can enhance the BIS error correction, so that it can be marked more erasures to improve the LDC data error correction.

Figure 7:
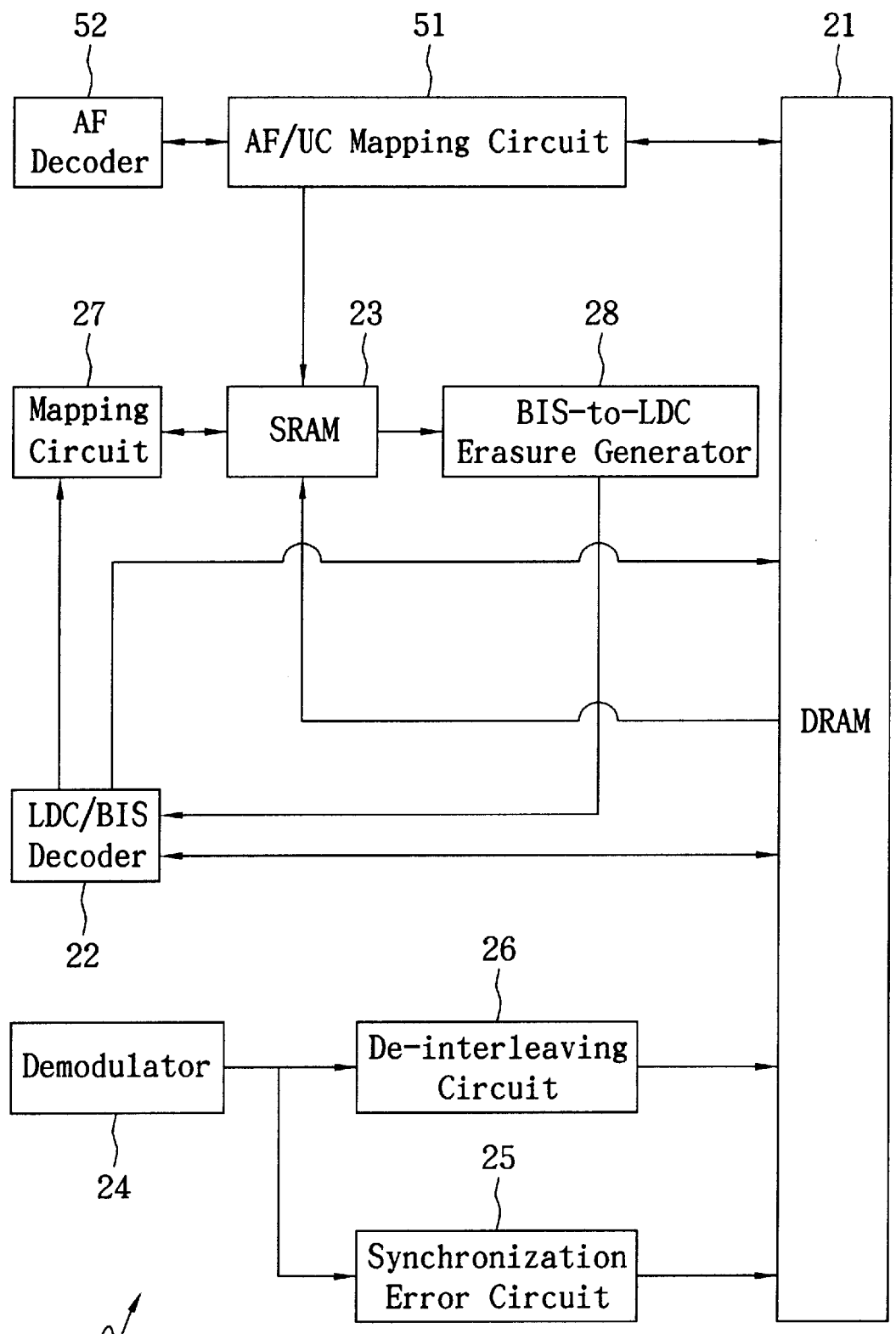
FIGS. 7 and 8 illustrate other apparatuses for decoding ECC clusters in accordance with the present invention.

Referring to FIG. 7, the address field (AF) information protected by BIS codes for determining the location in a disk and the user control data (UC) can also be used for LDC erasure generation. In comparison with the apparatus 20 in FIG. 2(a), an apparatus 50 comprises an AF decoder 52 and an AF/UC mapping circuit 51, which are further added. The user control data (UC) information that is not specified by the application is usually equal to zero. Accordingly, if the address number between close clusters is incorrect, the user control data is not equal to zero, or the errors are detected during AF decoding, they can be deemed to be AF/UC decoding error. The generated AF/UC erasure indicators are stored in the SRAM 23 or in DRAM 21 for LDC erasure bit generation. The generated AF/UC erasure indicators may also integrate with BIS/SYNC erasure indicators for LDC decoding.

Figure 8:
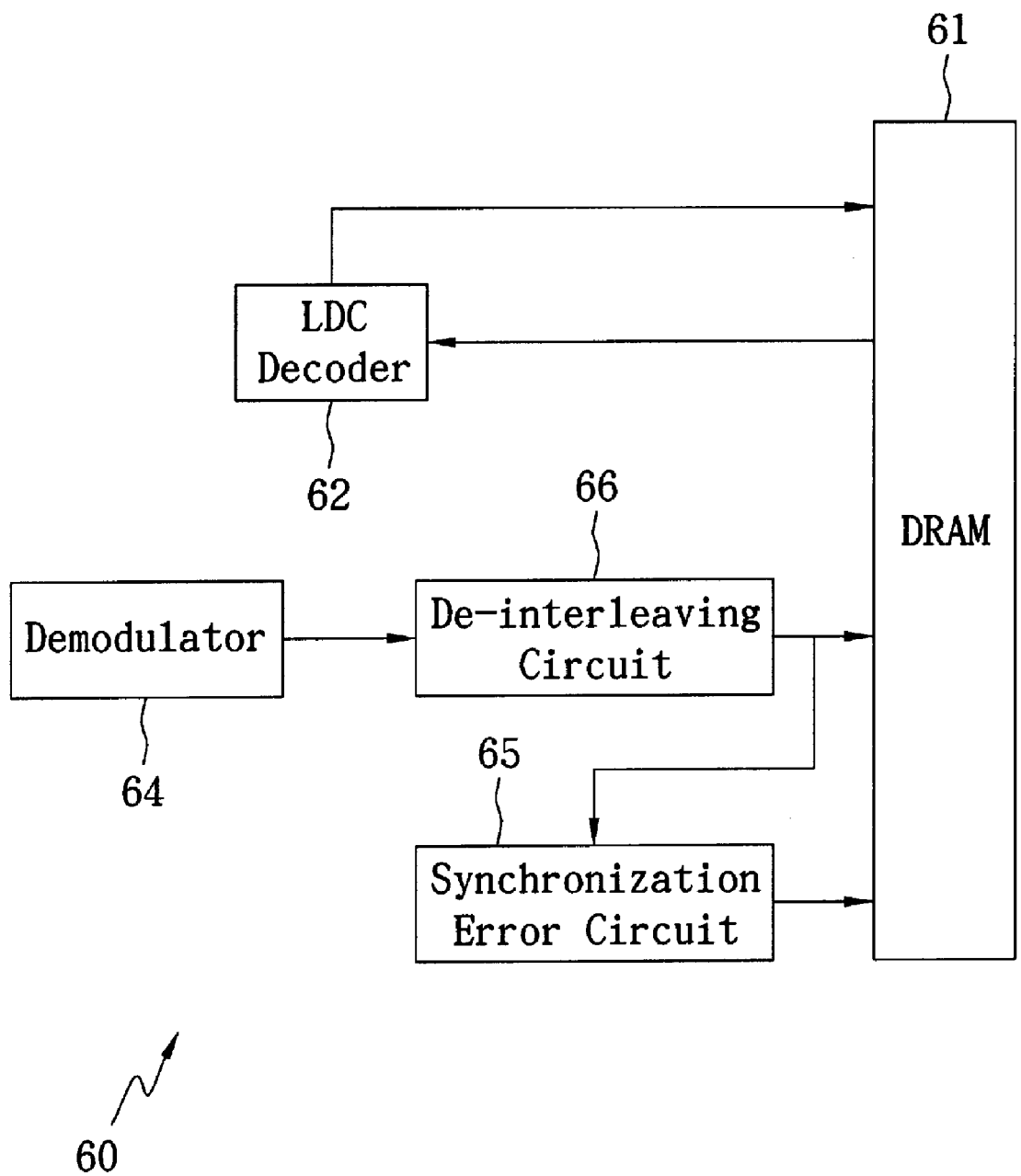

Alternatively, an apparatus without SRAM can also be employed. Referring to FIG. 8, an apparatus 60 for decoding multiword information includes a DRAM 61, a demodulator 64, a synchronization error circuit 65, a de-interleaving circuit 66 and an LDC/BIS decoder 62. The operations of the demodulator 64, the synchronization error circuit 65 and the de-interleaving circuit 66 are the same as those in FIG. 2(a), but the BIS erasure indicator is stored in the DRAM 61 instead of the SRAM 23 for LDC decoding. Because the LDC data are interleaved in an ECC cluster, i.e., the LDC data is discontinuous and disposed in multiple LDC blocks, the location of every LDC data has to be retrieved from the DRAM 61 individually. Thus, the DRAM bandwidth has to increase if all the erasure indicators are stored in the DRAM 61, and therefore the decoding efficiency will be decreased in comparison with that of the apparatus 20 in FIG. 2(a). Nevertheless, because the SRAM, the related mapping circuit, and erasure generator can be omitted, a simplified circuit will be acquired.

In order to reduce the impact of decoding efficiency, the incremental manner to access the erasure indicator region in need of change, as shown in FIG. 5(c), can decrease the impact to DRAM bandwidth. Another erasure indicators access method without exact BIS location mapping may be applied to reduce the DRAM access. In other words, the erasure indicators being read out are used for multiple codewords, and are influenced where the erasure indicator located at different region. Because there is a simplified BIS location mapping operation, the location for LDC data is relatively inaccurate. This simplified BIS location mapping operation can also be used for the access of SRAM 23 in FIG. 2(a). Furthermore, after BIS decoding, the erasure indicator can finish the strategy selection and computation, and stored in DRAM afterwards.

For LDC decoding, the erasure indicators generated by different ways such as BIS, SYNC, AF, UC can be associated adequately as LDC's erasures. For BIS decoding, the erasure indicators generated by AF, UC, or SYNC can be the BIS's erasure. The decoding of BIS codes can also include address field information, and the erasure indicators for BIS are determined by decoding faults or address comparison faults of the address field information. Similarly, the erasure indicators for BIS can also be determined by user control data information. Furthermore, the SYNC and the data quality information from read channel could be a clue to the erasure indicators for BIS decoding.

The above-described embodiments of the present invention are intended to be illustrative only. Numerous alternative embodiments may be devised by those skilled in the art without departing from the scope of the following claims.

What is claimed is:

1. A method for decoding multiword information, comprising the steps of:
   providing a multiword information cluster including high protective codewords and low protective codewords;
   storing the low protective codewords into a first memory;
   decoding the high protective codewords so as to generate high protective word erasure indicators showing whether decoding errors occur;
   storing the high protective word erasure indicators into a second memory;
   decoding the low protective codewords read from the first memory by means of an erasure indicator read from the second memory; and
   marking an erasure bit for decoding the low protective codewords if at least one high protective word erasure indicator exists at a high protective codeword next to the low protective codeword.

2. The method for decoding multiword information in accordance with claim 1, wherein the multiword information cluster is an error correction code (ECC) cluster, and the high and low protective codewords are burst indicator subcodes (BIS) and long-distance codes (LDC), respectively.

3. The method for decoding multiword information in accordance with claim 1, further comprising the steps of:
   detecting errors of synchronization codes included in the multiword information cluster so as to generate sync erasure indicators; and
   storing the sync erasure indicators into the first memory;
   wherein the sync erasure indicators function as the high protective word erasure indicators for generating the erasure bit while the low protective codewords are being decoded.

4. The method for decoding multiword information in accordance with claim 2, wherein the BIS codes include address field information, and the high protective word erasure indicators are determined by decoding errors or address comparison faults of the address field information.

5. The method for decoding multiword information in accordance with claim 2, wherein the BIS codes include user control data, and the high protective word erasure indicators are determined by the user control data.

6. A method for decoding multiword information, comprising the steps of:
   providing a multiword information cluster including high protective codewords and low protective codewords;
   storing the low protective codewords into a first memory;
   decoding the high protective codewords so as to generate high protective word erasure indicators showing whether decoding errors occur;
   storing the high protective word erasure indicators into a second memory;
   decoding the low protective codewords read from the first memory by means of an erasure indicator read from the second memory; and
   marking an erasure bit for decoding the low protective codewords if at least one high protective word erasure indicator exists at a high protective codeword next to the low protective codeword at each side.

7. The method for decoding multiword information in accordance with claim 6, wherein the multiword information cluster is an error correction code (ECC) cluster, and the high and low protective codewords are burst indicator subcodes (BIS) and long-distance codes (LDC), respectively.

8. The method for decoding multiword information in accordance with claim 6, further comprising the steps of:
   detecting errors of synchronization codes included in the multiword information cluster so as to generate sync erasure indicators; and
   storing the sync erasure indicators into the first memory;
   wherein the sync erasure indicators function as the high protective word erasure indicators for generating the erasure bit while the low protective codewords are being decoded.

9. The method for decoding multiword information in accordance with claim 7, wherein the BIS codes include address field information, and the high protective word erasure indicators are determined by decoding errors or address comparison faults of the address field information.

10. The method for decoding multiword information in accordance with claim 7, wherein the BIS codes include user control data, and the high protective word erasure indicators are determined by the user control data.

11. A method for decoding multiword information, comprising the steps of:
providing a multiword information cluster including high protective codewords and low protective codewords;
storing the low protective codewords into a first memory;
decoding the high protective codewords so as to generate high protective word erasure indicators showing whether decoding errors occur;
storing the high protective word erasure indicators into a second memory;
decoding the low protective codewords read from the first memory by means of an erasure indicator read from the second memory; and
marking an erasure bit for decoding the low protective codewords if at least two high protective word erasure indicators exist at two high protective codewords next to the low protective codeword.

12. The method for decoding multiword information in accordance with claim 11, wherein the multiword information cluster is an error correction code (ECC) cluster, and the high and low protective codewords are burst indicator subcodes (BIS) and long-distance codes (LDC), respectively.

13. The method for decoding multiword information in accordance with claim 11, further comprising the steps of:
detecting errors of synchronization codes included in the multiword information cluster so as to generate sync erasure indicators; and
storing the sync erasure indicators into the first memory;
wherein the sync erasure indicators function as the high protective word erasure indicators for generating the erasure bit while the low protective codewords are being decoded.

14. The method for decoding multiword information in accordance with claim 12, wherein the BIS codes include address field information, and the high protective word erasure indicators are determined by decoding errors or address comparison faults of the address field information.

15. The method for decoding multiword information in accordance with claim 12, wherein the BIS codes include user control data, and the high protective word erasure indicators are determined by the user control data.

16. A method for decoding multiword information, comprising the steps of:
providing a multiword information cluster including high protective codewords and low protective codewords;
storing the low protective codewords into a DRAM;
decoding the high protective codewords so as to generate high protective word erasure indicators showing whether decoding errors occur;
storing the high protective word erasure indicators into a memory;
decoding the low protective codewords read from the DRAM by means of an erasure indicator read from the memory; and
marking an erasure bit for decoding the low protective codewords based on the high protective word erasure indicators close to any low protective codeword in the multiword information cluster.

17. A method for decoding multiword information, comprising the steps of:
providing a multiword information cluster including high protective codewords and low protective codewords;
storing the low protective codewords into a first memory;
decoding the high protective codewords so as to generate high protective word erasure indicators showing whether decoding errors occur;
storing the high protective word erasure indicators into a second memory;
decoding the low protective codewords read from the first memory by means of an erasure indicator read from the second memory; and
marking an erasure bit for decoding the low protective codewords if at least one high protective word erasure indicator or synchronization code error exists next to the low protective codeword.

18. The method for decoding multiword information in accordance with claim 17, wherein the multiword information cluster is an error correction code (ECC) cluster, and the high and low protective codewords are burst indicator subcodes (BIS) and long-distance codes (LDC), respectively.

19. The method for decoding multiword information in accordance with claim 17, wherein the BIS codes include address field information, and the high protective word erasure indicators are determined by decoding errors or address comparison faults of the address field information.

20. The method for decoding multiword information in accordance with claim 17, wherein the BIS codes include user control data, and the high protective word erasure indicators are determined by the user control data.

21. A method for decoding multiword information, comprising the steps of:
receiving a multiword information cluster comprising high protective codewords and low protective codewords;
decoding the high protective codewords so as to generate high protective word erasure indicators showing whether decoding error occurs;
storing the high protective word erasure indicators into a memory;
generating an erasure bit corresponding to one of the low protective codewords if the high protective word erasure indicator associated with one of the high protective codewords, which is adjacent to said one of the low protective codewords, shows an error; and
decoding said one of the low protective codewords according to the erasure bit.

22. The method for decoding multiword information in accordance with claim 21, wherein the high protective codewords comprises synchronization codes.

23. A method for decoding multiword information, comprising the steps of:
receiving a multiword information cluster including high protective codewords and low protective codewords;
decoding the high protective codewords so as to generate high protective word erasure indicators showing whether decoding error occurs;
storing the high protective word erasure indicators into a memory;
generating an erasure bit corresponding to one of the low protective codewords if the high protective word erasure indicators associated with the high protective codewords, which are respectively adjacent to said one of the low protective codewords, show errors; and
decoding said one of the low protective codewords according to the erasure bit.

24. The method for decoding multiword information in accordance with claim 23, wherein the high protective codewords comprise synchronization codes.

25. A method for decoding multiword information, comprising the steps of:

receiving a multiword information cluster including high protective codewords and low protective codewords, wherein the high protective codewords and low protective codewords are arranged in an alternating fashion such that a low protective codeword has directly neighboring and next-to-directly neighboring high protective codewords;

decoding the high protective codewords so as to generate high protective word erasure indicators showing whether decoding error occurs;

storing the high protective word erasure indicators into a memory;

generating an erasure bit corresponding to one of the low protective codewords if the high protective word erasure indicators associated with the directly neighboring and the next-to-directly neighboring high protective codewords, which are next to said one of the low protective codewords, show errors; and decoding said one of the low protective codewords according to the erasure bit.

26. The method for decoding multiword information in accordance with claim 25, wherein the high protective codewords comprise synchronization codes.

\* \* \* \* \*